United States Patent
Tu et al.

(10) Patent No.: US 8,426,275 B2
(45) Date of Patent: Apr. 23, 2013

(54) FABRICATION METHOD OF TRENCHED POWER MOSFET

(75) Inventors: Kou-Way Tu, New Taipei (TW); Hsiu-Wen Hsu, Hsinchu County (TW); Yi-Yun Tsai, Penghu County (TW); Yuan-Shun Chang, Taipei (TW)

(73) Assignee: Niko Semiconductor Co., Ltd., New Taipei (TW)

( * ) Notice: Subject to any disclaimer, the term of this patent is extended or adjusted under 35 U.S.C. 154(b) by 0 days.

(21) Appl. No.: 13/225,555

(22) Filed: Sep. 6, 2011

(65) Prior Publication Data

US 2011/0318895 A1 Dec. 29, 2011

Related U.S. Application Data

(63) Continuation-in-part of application No. 12/389,360, filed on Feb. 19, 2009, now abandoned.

(30) Foreign Application Priority Data

Jan. 9, 2009 (TW) ................................ 98100617 A

(51) Int. Cl.
*H01L 21/336* (2006.01)

(52) U.S. Cl.
USPC ............... 438/270; 257/330; 257/E29.133; 257/E21.419

(58) Field of Classification Search ............. 257/E29.133
See application file for complete search history.

(56) References Cited

U.S. PATENT DOCUMENTS

| | | | |
|---|---|---|---|
| 4,893,160 A | | 1/1990 | Blanchard |
| 5,378,655 A | * | 1/1995 | Hutchings et al. ............ 438/138 |
| 5,442,214 A | * | 8/1995 | Yang ............................ 257/328 |
| 6,252,277 B1 | * | 6/2001 | Chan et al. .................... 257/330 |
| 6,285,060 B1 | | 9/2001 | Korec et al. |
| 6,291,298 B1 | * | 9/2001 | Williams et al. .............. 438/270 |
| 6,423,618 B1 | | 7/2002 | Lin et al. |
| 6,433,385 B1 | | 8/2002 | Kocon et al. |
| 6,495,884 B2 | | 12/2002 | Harada et al. |
| 6,521,498 B2 | * | 2/2003 | Zandt In't et al. ............ 438/270 |
| 6,573,569 B2 | | 6/2003 | Hao et al. |
| 6,709,930 B2 | | 3/2004 | Chan et al. |
| 6,800,509 B1 | | 10/2004 | Lin et al. |
| 6,849,507 B2 | | 2/2005 | Thapar |
| 6,849,898 B2 | | 2/2005 | Darwish et al. |
| 6,882,000 B2 | | 4/2005 | Darwish et al. |
| 7,012,005 B2 | | 3/2006 | Lichtenberger et al. |
| 7,282,406 B2 | | 10/2007 | Grivna et al. |
| 2002/0175412 A1 | | 11/2002 | Kocon et al. |

(Continued)

*Primary Examiner* — Michelle Mandala
*Assistant Examiner* — Shaka White
(74) *Attorney, Agent, or Firm* — Jianq Chyun IP Office

(57) ABSTRACT

A fabrication method of a trenched power MOSFET is provided. A pattern layer having a first opening is formed on a substrate. A portion of the substrate is removed, using the pattern layer as a mask, to form a trench in the substrate. A width of the trench is expanded. A gate oxide layer is formed on a surface of the trench. A portion of the gate oxide layer on a bottom of the trench is removed, using the pattern layer as a mask, to form a second opening in the gate oxide layer. The width of the expanded trench is greater than that of the second opening. A thick oxide layer is formed in the second opening. Heavily doped regions are formed beside the thick oxide layer. A gate is formed in the trench. A body layer surrounding the trench is formed. Sources are formed beside the trench.

26 Claims, 17 Drawing Sheets

U.S. PATENT DOCUMENTS

2003/0235958 A1* 12/2003 Chan et al. .................... 438/270
2005/0215012 A1    9/2005 Williams et al.
2006/0086972 A1*  4/2006 Shibata et al. ................ 257/330
2006/0138535 A1*  6/2006 Ono et al. ..................... 257/330
2007/0093077 A1*  4/2007 Grivna .......................... 438/787
2009/0085107 A1    4/2009 Hshieh

* cited by examiner

FABRICATION METHOD OF TRENCHED POWER MOSFET

CROSS-REFERENCE TO RELATED APPLICATION

This is a continuation-in-part application of and claims the priority benefit of U.S. application Ser. No. 12/389,360, filed Feb. 19, 2009, now pending. The prior application Ser. No. 12/389,360 claims the priority benefit of Taiwan application serial no. 98100617, filed on Jan. 9, 2009. The entirety of each of the above-mentioned patent applications is hereby incorporated by reference herein and made a part of this specification.

BACKGROUND OF THE INVENTION

1. Field of Invention

The present invention relates to a fabrication method of a trenched power metal-oxide-semiconductor field effect transistor (power MOSFET), and more generally to a fabrication method of a trenched power MOSFET which can reduce the MOSFET switching loss.

2. Description of Related Art

A power MOSFET is widely applied to power switch devices such as power supplies, converters or low voltage controllers. Generally speaking, a conventional power MOSFET is usually designed as a vertical transistor for enhancing the device density, wherein for each transistor, each drain region is formed on the back-side of a chip, and each source region and each gate are formed on the front-side of the chip. The drain regions of the transistors are connected in parallel so as to endure a considerable large current.

The working loss of the power MOSFET can be divided into a switching loss and a conducting loss. The switching loss caused by the input capacitance $C_{iss}$ is going up as the operation frequency is increased. The input capacitance $C_{iss}$ includes a gate-to-source capacitance $C_{gs}$ and a gate-to-drain capacitance $C_{gd}$. When the gate-to-drain capacitance $C_{gd}$ is decreased, the switching loss is accordingly reduced, and the avalanche energy is improved under the unclamped inductive load switching (UIS).

Accordingly, how to fabricate a power MOSFET having a low gate-to-drain capacitance $C_{gd}$ has become one of the main topics in the industry.

SUMMARY OF THE INVENTION

One object of the present invention is to provide a fabrication method of a trenched power MOSFET, in which the thickness of insulating layer between the gate and the drain can be increased, so as to decrease the gate-to-drain capacitance $C_{gd}$ and reduce the switching loss.

Another object of the present invention is to provide a fabrication method of a trenched power MOSFET, in which the profile of the body layer is adjusted to enhance the avalanche energy.

To achieve the above-mentioned objects, the present invention provides a fabrication method of a trenched power MOSFET at least including the following steps. A pattern layer having a first opening is formed on a substrate. A portion of the substrate is removed by using the pattern layer as a mask, so as to form a gate trench in the substrate. A width of the gate trench is expanded. A gate oxide layer is formed on an inner surface of the gate trench. A portion of the gate oxide layer on a bottom of the gate trench is removed by using the pattern layer as a mask, so as to form a second opening exposing the substrate and located in the gate oxide layer, wherein a width of the expanded gate trench is greater than a width of the second opening. A thick oxide layer is formed in the second opening. Two first heavily doped regions are formed at two sides of the thick oxide layer. A gate polysilicon structure is formed in the gate trench. A body layer is formed to surround the gate trench. Two source doped regions are formed at two sides of the gate trench.

According to an embodiment of the present invention, when the pattern layer is used as a mask, the gate trench prior to the expanding step, the first opening and the second opening have substantially the same width.

According to an embodiment of the present invention, when the pattern layer is used as a mask, the width of the expanded gate trench is greater than a width of the first opening.

According to an embodiment of the present invention, a method of expanding the width of the gate trench includes the following steps. The substrate is oxidized to form a first oxide layer in the gate trench, wherein the first oxide layer at least covers a sidewall of the gate trench and consumes a portion of the substrate. The first oxide layer is removed.

According to an embodiment of the present invention, a method of removing the first oxide layer includes performing an isotropic etching process.

According to an embodiment of the present invention, a depth of the body layer is increased in a direction away from the gate trench, and the first heavily doped regions adjust a depth profile of the body layer.

According to an embodiment of the present invention, the fabrication method further includes forming a dielectric structure on the gate polysilicon structure after the step of forming the first heavily doped regions.

According to an embodiment of the present invention, the fabrication method further includes forming a first spacer structure in the first opening of the pattern layer after the step of forming the pattern layer, wherein the gate trench is formed in the substrate by using the pattern layer and the first spacer structure as a mask.

According to an embodiment of the present invention, the width the second opening is equal to a width of the third opening defined to correspond to the first spacer structure in the first opening.

According to an embodiment of the present invention, the gate trench prior to the expanding step, the second opening and the third opening have substantially the same width.

According to an embodiment of the present invention, the width of the expanded gate trench is greater than the width of the third opening.

According to an embodiment of the present invention, the thick oxide layer is formed in the second opening by a wet oxidation process.

According to an embodiment of the present invention, the thick oxide layer is formed in the second opening by a deposition process.

According to an embodiment of the present invention, a narrow trench is formed below the second opening during the step of forming the second opening, and an opening width of the narrow trench corresponds to the width of the second opening.

According to an embodiment of the present invention, the step of forming the first heavily doped regions includes forming a heavily doped region in the substrate below the gate trench before the step of forming the second opening, so that the narrow trench penetrates the heavily doped region and the first heavily doped regions are formed at two sides of the narrow trench.

According to an embodiment of the present invention, the step of forming the first heavily doped regions includes forming a heavily doped region in the substrate below the gate trench before the step of forming the second opening, so that the thick oxide layer penetrates the heavily doped region and the first heavily doped regions are formed at two sides of the thick oxide layer.

According to an embodiment of the present invention, a thickness of the first oxide layer is greater than a thickness of the gate oxide layer.

According to an embodiment of the present invention, the step of forming the first heavily doped regions includes performing an ion implantation process after the step of forming the thick oxide layer, so that the first heavily doped regions are formed at two sides of the thick oxide layer.

According to an embodiment of the present invention, the ion implantation process includes a tilt ion implantation process.

According to an embodiment of the present invention, the fabrication method further includes, after the step of forming the second opening, performing an etching process to expand the width of the first opening of the pattern layer, so as to expose an entire opening of the gate trench.

According to an embodiment of the present invention, the fabrication method further includes removing the first spacer structure to expose an entire opening of the gate trench after the step of forming the second opening.

According to an embodiment of the present invention, the dielectric structure is disposed in the first opening.

According to an embodiment of the present invention, the fabrication method further includes, after the step of forming the dielectric structure, forming a second spacer structure at two sides of the dielectric structure, so as to define the source doped regions at two sides of the gate trench.

According to an embodiment of the present invention, the dielectric structure is disposed in the gate trench.

According to an embodiment of the present invention, the fabrication method further includes the following steps after the step of forming the dielectric structure. A portion of the substrate is removed by using the dielectric structure as a mask, so that the dielectric structure protrudes from the substrate. A third spacer structure is formed at two sides of the dielectric structure, so as to define the source doped regions at two sides of the gate trench.

According to an embodiment of the present invention, the fabrication method further includes removing the pattern layer after the step of forming the first heavily doped regions and before the step of forming the body layer.

In order to make the aforementioned and other objects, features and advantages of the present invention comprehensible, a preferred embodiment accompanied with figures is described in detail below.

DESCRIPTION OF EMBODIMENTS

Figure 1:
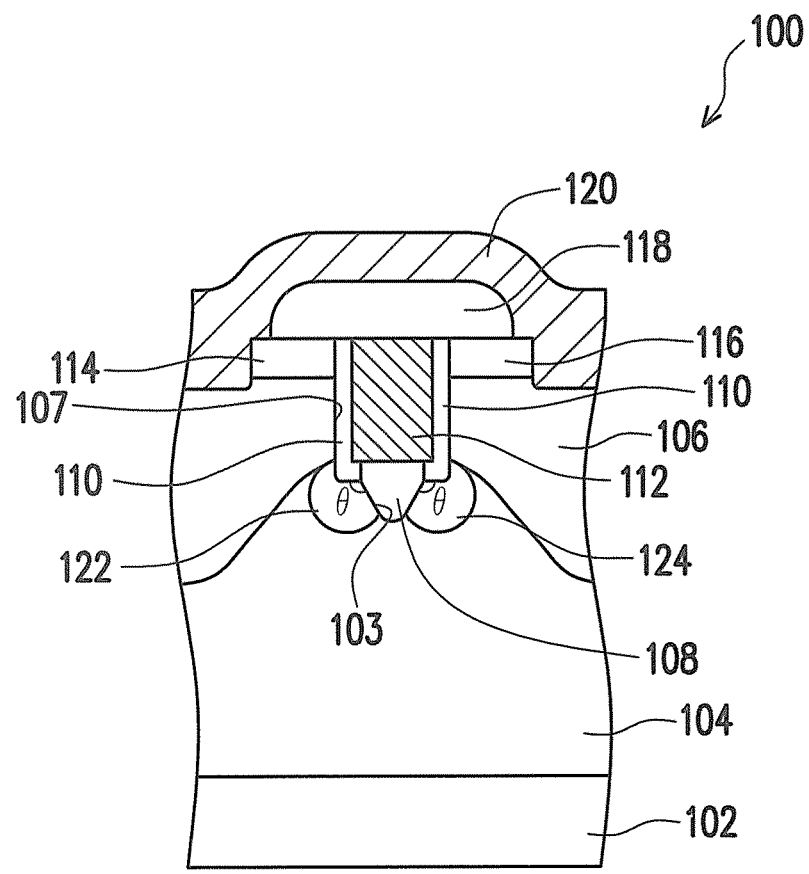
FIG. 1 schematically illustrates, in a cross-sectional view, a power MOSFET according to an embodiment of the present invention.

FIG. 1 schematically illustrates, in a cross-sectional view, a power MOSFET according to an embodiment of the present invention.

Referring to FIG. 1, a power MOSFET 100 of the present invention includes a substrate 102 of a first conductivity type, an epitaxial layer 104 of the first conductivity type, a body layer 106 of a second conductivity type, an insulating layer 108, an insulating layer 110, a conductive layer 112, source regions 114 and 116 of the first conductivity type, a dielectric layer 118, a conductive layer 120, and heavily doped regions 122 and 124 of the first conductivity type. The substrate 102 is, for example, a heavily N-doped (N+) silicon substrate, which serves as a drain region of the power MOSFET 100. The epitaxial layer 104 is disposed on the substrate 102. The epitaxial layer 104 is a lightly N-doped (N−) epitaxial layer, for example. The body layer 106 is disposed in the epitaxial layer 104. The body layer 106 is a P-type body layer, for example.

The body layer 106 has a trench 107 therein. The trench 107 extends to the epitaxial layer 104 below the body layer 106. The epitaxial layer 104 has a trench 103 therein. The trench 103 is disposed below the trench 107, and the width of the trench 103 is much smaller than that of the trench 107. For example, the width of the trench 107 is about 2-3 times that of the trench 103, the depth of the trench 107 is greater than about 0.8 um, and the depth of the trench 103 is greater than about 0.15 um. As shown in FIG. 1, the included angle between the sidewall of the trench 103 and the bottom of the trench 107 is greater than or equal to about 90 degree, for example, but the present invention is not limited thereto.

Further, the insulating layer 108 is at least disposed in the trench 103. The insulating layer 108 is formed by using a material selected from silicon oxide, silicon nitride and a high-k material with a dielectric constant more than 4, for example. The conductive layer 112 is disposed in the trench 107 and serves as a gate of the power MOSFET 100. The conductive layer 112 includes doped polysilicon. Metal silicide can be formed on the doped polysilicon for reducing the gate resistance. The insulating layer 110 is at least disposed between the sidewall of the trench 107 and the conductive layer 112, wherein a portion of the insulating layer 110 is further disposed between the conductive layer 112 and the epitaxial layer 104 below the trench 107. The insulating layer 110 is formed by using a material selected from silicon oxide, silicon nitride and a high-k material with a dielectric constant more than 4, for example. In an embodiment, the material of the insulating layer 108 is the same as that of the insulating layer 110. In another embodiment, the material of the insulating layer 108 is different from that of the insulating layer 110. The source regions 114 and 116 are disposed in the body layer 106 beside the trench 107 respectively. The source regions 114 and 116 are N-type heavily doped regions, for example. The dielectric layer 118 is disposed on the conductive layer 112 and the source regions 114 and 116. The dielectric layer 118 is formed by using a material selected from silicon oxide, borophosphosilicate glass (BPSG), phosphosilicate glass (PSG), fluorosilicate glass (FSG) and undoped silicon glass (USG), for example. The conductive layer 120 is disposed on the dielectric layer 118 and electronically connected to at least one of the source regions 114 and 116. In this embodiment, the conductive layer 120 is electronically connected to both of the source regions 114 and 116. The conductive layer 120 is composed of aluminum, for example. In this embodiment, the heavily doped regions 122 and 124 are disposed in the epitaxial layer 104 below the trench 107 and beside the trench 103, respectively, but the present invention is not limited thereto. For example, in another embodiment, the heavily doped regions 122 and 124 may further extend to the lower edge of the sidewall of the trench 107. The heavily doped regions 122 and 124 are N-type heavily doped regions, for example.

In the present invention, the power MOSFET 100 has the trench 103 extending toward the substrate 102 from the bottom of the trench 107, so as to increase the thickness of the insulating layer 108 between the conductive layer 112 in the trench 107 and the bottom of the trench 103. Thus, the gate-to-drain capacitance $C_{gd}$ is effectively decreased, the switching loss is reduced, and the avalanche energy under the UIS is promoted.

Further, the presence of the heavily doped regions 122 and 124 can adjust the depth distribution of the body layer 106. As shown in FIG. 1, the downward diffusion depth of the body layer 106 adjacent to the trench 107 is limited by the presence of the heavily doped regions 122 and 124, so that transistor failure due to the expansion of body layer 106 to cover the bottom of the trench 107 is avoided. Meanwhile, as shown in FIG. 1, the body layer 106 has a greater thickness away from the trench 107, which is beneficial to prevent the avalanche current from penetrating the insulation layer between the epitaxial layer 104 and the conductive layer 112.

Several embodiments are numerated below to illustrate the method of fabricating the power MOSFET of the present invention.

First Embodiment

FIGS. 1A to 1D schematically illustrate, in a cross-sectional view, a method of fabricating a power MOSFET according to a first embodiment of the present invention.

Figure 1A:
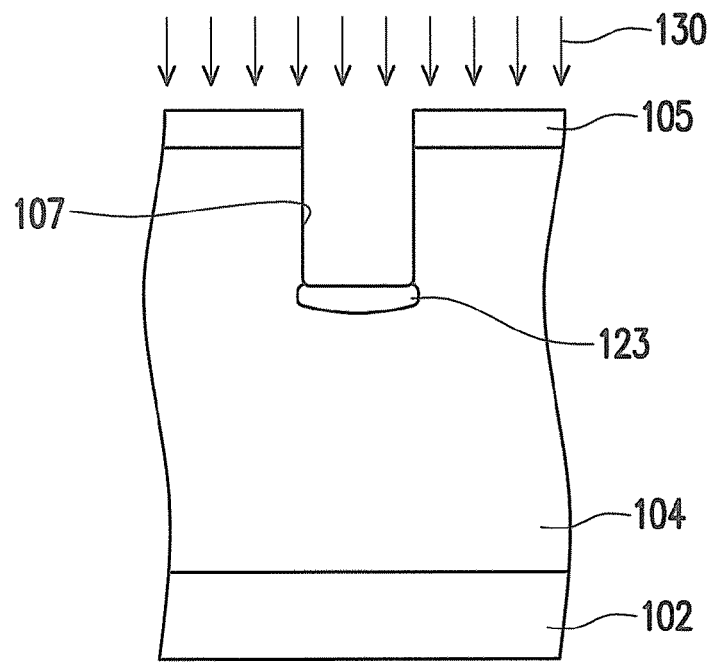
FIGS. 1A to 1D schematically illustrate, in a cross-sectional view, a method of fabricating a power MOSFET according to a first embodiment of the present invention.

Referring to FIG. 1A, an epitaxial layer 104 of a first conductivity type and a patterned mask layer 105 are sequentially formed on a substrate 102 of the first conductivity type. The substrate 102 serving as a drain region is a heavily N-doped silicon substrate, for example. The epitaxial layer 104 is a lightly N-doped epitaxial layer, which may be formed by using a selective epitaxy growth (SEG) process, for example. The patterned mask layer 105 is a stacked layer including a silicon oxide layer and a silicon nitride layer, for example. The patterned mask 105 layer may be formed by performing a chemical vapor deposition (CVD) process, for example. Thereafter, an etching process is performed using the patterned mask layer 105 as a mask, so as to form a trench 107 in the epitaxial layer 104. The depth of the trench 107 is greater than about 0.8 um, for example. Afterwards, an ion implantation process is performed to implant ions 130 in the epitaxial layer 104, so as to form a heavily doped region 123 of the first conductivity type in the epitaxial layer 104. Both of the above-mentioned ion implantation process and the etching process use the patterned mask layer 105 as a mask. Thus, the ion implantation process can be considered self-aligned process to have the heavily doped region 123 precisely formed below the trench 107. The heavily doped region 123 is an N-type heavily doped region, and the N-type dopants include phosphorus or arsenic, for example.

Figure 1B:
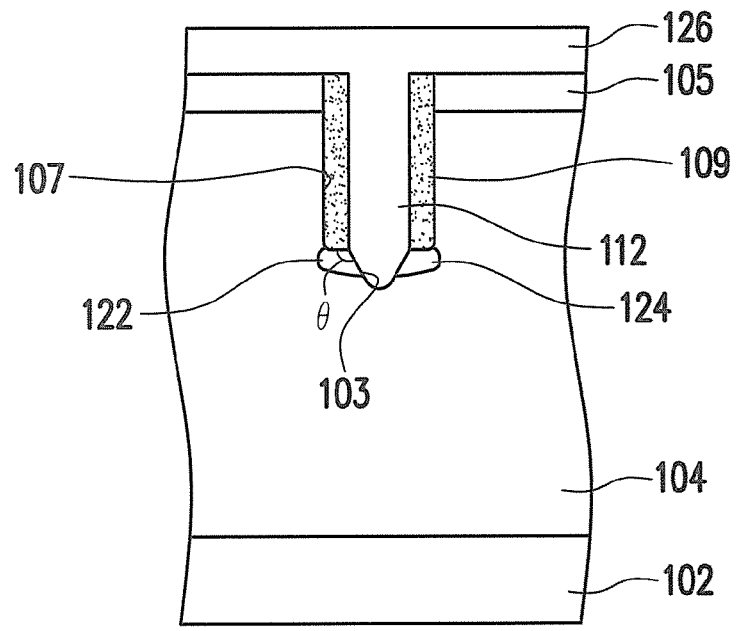

Referring to FIG. 1B, a spacer material layer (not shown) is conformally formed on the substrate 102. Thereafter, an anisotropic etching process is performed to remove a portion of the spacer material layer, so as to form a spacer 109 on the sidewall of the trench 107. The spacer material layer is composed of silicon nitride, for example, and the spacer material layer may be formed by performing a CVD process, for example. Afterwards, a portion of the epitaxial layer 104 is removed using the spacer 109 as a mask, so as to form a trench 103 below the bottom of the trench 107. Since the trench 103 is formed right below the trench 107 using the spacer 109 as a mask, the step of forming the trench 103 can be considered a self-aligned process, which have the trench 103 aligned to the center of the bottom of the trench 107. In addition, the trench 103 divides the heavily doped region 123 into two heavily doped regions 122 and 124. The width of the trench 103 is about ½~⅓ times that of the trench 107, and the depth of the trench 103 is greater than about 0.15 um, for example. The included angle between the sidewall of the trench 103 and the bottom of the trench 107 is greater than or equal to about 90 degree, for example. It is noted that a portion of the heavily doped region 123 right below the trench 107 is removed by the formation of the trench 103, so as to prevent the current from concentrating to the bottom of the trench 103 protruding downward from the bottom of the trench 107. Further, an insulating material layer 126 is formed on the substrate 102 to fill up the trench 103 and the trench 107. The insulating material layer 126 is formed by using a material selected from silicon oxide, silicon nitride and a high-k material with a dielectric constant more than 4, for example. The method of forming the insulating material layer 126 includes performing a CVD process or a spin-coating process, for example.

Figure 1C:
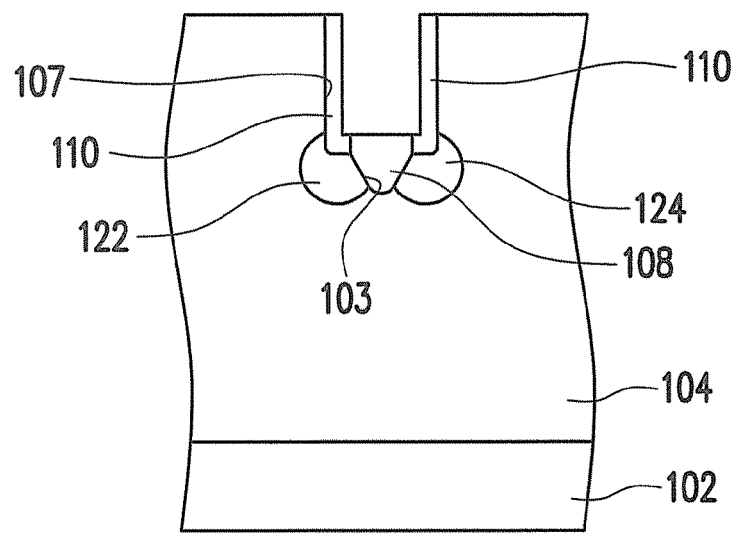

Referring to FIG. 1C, an etching back process is performed to remove a portion of the insulating material layer 126, so as to form an insulating layer 108. The insulating layer 108 at least fills up the trench 103. Thereafter, the patterned mask layer 105 and the spacer 109 are removed. Afterwards, an insulating layer 110 is at least formed on the sidewall of the trench 107. The insulating layer 110 is formed by using a material selected from silicon oxide, silicon nitride and a high-k material with a dielectric constant more than 4, for example. In this embodiment, the insulating layer 110 is formed on the sidewall and bottom of the trench 107 through a CVD process. Meanwhile, the heavily doped regions 122 and 124 diffuse to the surrounding thereof to cover a portion of the sidewall of the trench 107 due to high temperature in the step of forming the insulating layer 110.

Figure 1D:
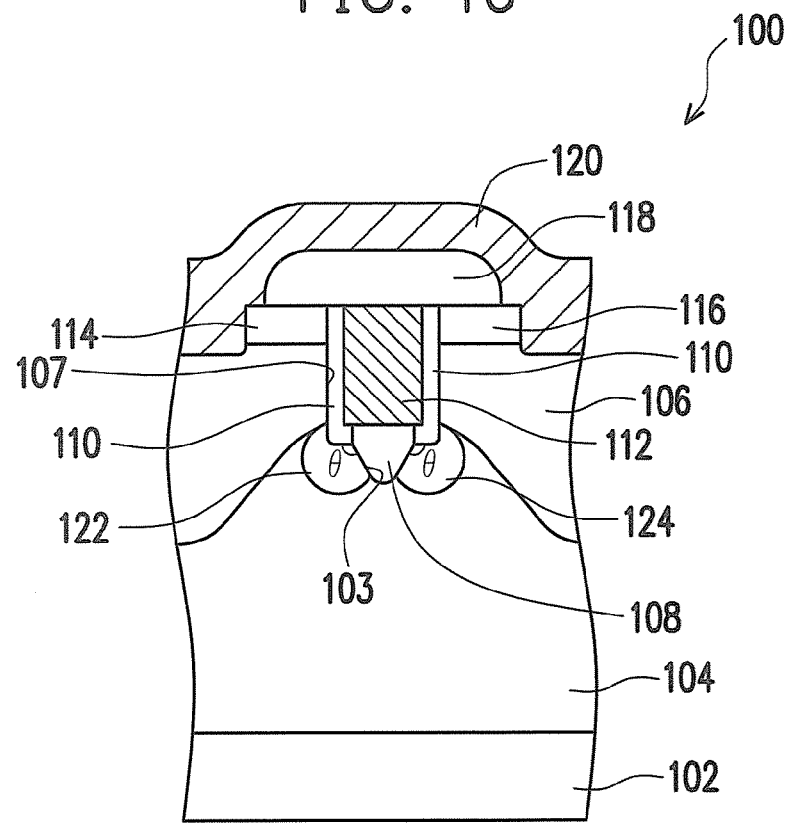

Referring to FIG. 1D, a conductive layer 112 is formed in the trench 107. The conductive layer 112 includes doped polysilicon, for example. Metal silicide can be formed on the doped polysilicon for reducing the gate resistance. The method of forming the conductive layer 112 includes performing a CVD process, for example. Thereafter, a body layer 106 of a second conductivity type is formed in the epitaxial layer 104 around the trench 107. The body layer 106 is a P-type body layer, which is formed by performing an ion implantation process and a subsequent drive-in process, for example. It is noted that N+ doped regions 122 and 124 are disposed in the epitaxial layer 104 beside the trench 103, so that the lower edge of the P-type body layer 106 is self-aligned to the lower portion of the sidewall of the trench 107. Failure of the power MOSFET due to the over-extension of the P-type body layer 106 to cover the bottom of the trench 107 is avoided. Therefore, the depth of the P-type body layer 106 can be increased as much as possible without worrying that the bottom of the trench 107 would be covered by the P-type body layer 106.

Referring to FIG. 1D, source regions 114 and 116 are formed in the body layer 106 beside the trench 107. The source regions 114 and 116 are N-type heavily doped regions, which may be formed by performing an ion implantation process, for example. Thereafter, a dielectric layer 118 is formed on the conductive layer 112 and the source regions 114 and 116. The dielectric layer 118 is formed by a material selected from silicon oxide, BPSG, PSG, FSG and USG, for example. The method of forming the dielectric layer 118 includes performing a CVD process, for example. Afterwards, a conductive layer 120 is formed on the dielectric layer 118 to electronically connect to the source regions 114 and 116. The conductive layer 120 is composed of aluminum, and the forming method thereof includes performing a CVD process, for example. The power MOSFET 100 of the first embodiment is thus completed.

Second Embodiment

FIGS. 2A to 2D schematically illustrate, in a cross-sectional view, a method of fabricating a power MOSFET according to a second embodiment of the present invention. The difference between the first embodiment and the second embodiment is that in the first embodiment, an ion implantation process is performed to implant ions 130 below the trench 107 before the formation of a trench 103, while in the second embodiment, a trench 103 is formed and an ion implantation process is then performed to implant ions 130. The difference between them is described in the following, and the unnecessary details are not reiterated.

Figure 2A:
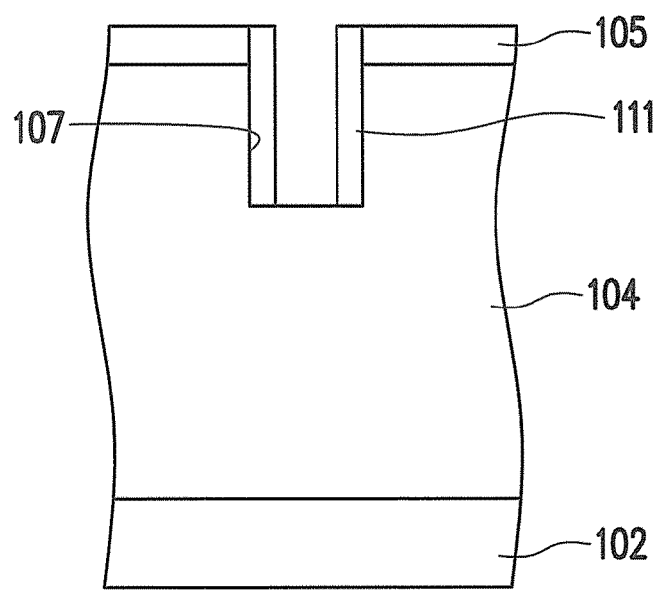
FIGS. 2A to 2D schematically illustrate, in a cross-sectional view, a method of fabricating a power MOSFET according to a second embodiment of the present invention.

Referring to FIG. 2A, an epitaxial layer 104 of a first conductivity type and a patterned mask layer 105 are sequentially formed on a substrate 102. Thereafter, an etching process is performed using the patterned mask layer 105 as a mask, so as to form a trench 107 in the epitaxial layer 104. Afterwards, a spacer material layer (not shown) is conformally formed on the substrate 102. An anisotropic etching process is then performed to remove a portion of the spacer material layer, so as to form a spacer 111 on the sidewall of the trench 107. The spacer material layer is composed of silicon oxide, and the forming method thereof includes performing a CVD process, for example.

Figure 2B:
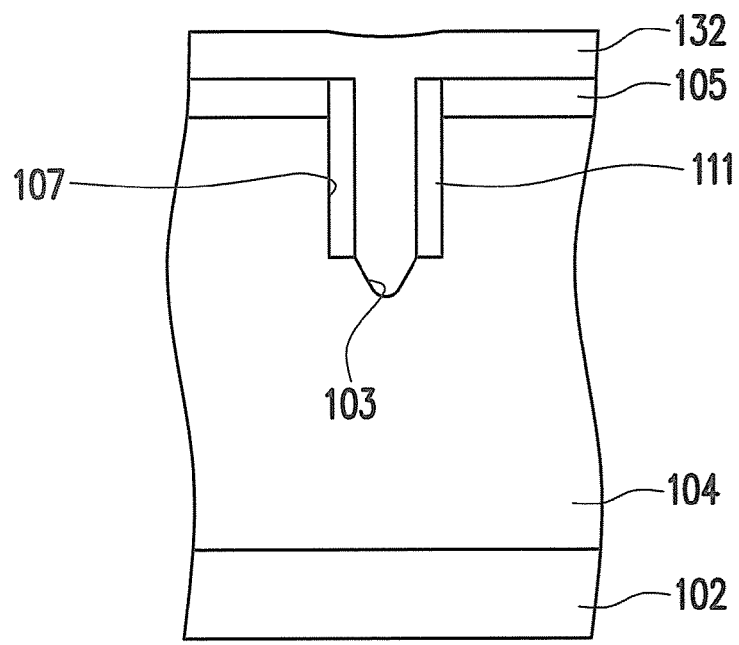

Referring to FIG. 2B, a portion of the epitaxial layer 104 is removed using the spacer 111 as a mask, so as to form a trench 103 below the trench 107. The trench 103 is self-aligned to the center of the trench 107 because of the spacer 111 lining the sidewall of the trench 107. Thereafter, an insulating material layer 132 is formed on the substrate 102 to fill up the trench 103 and the trench 107. The insulating material layer 132 is formed by using a material selected from silicon oxide, silicon nitride and a high-k material with a dielectric constant more than 4, for example. The method of forming the insulating material layer 132 includes performing a CVD process or a spin-coating process, for example.

Figure 2C:
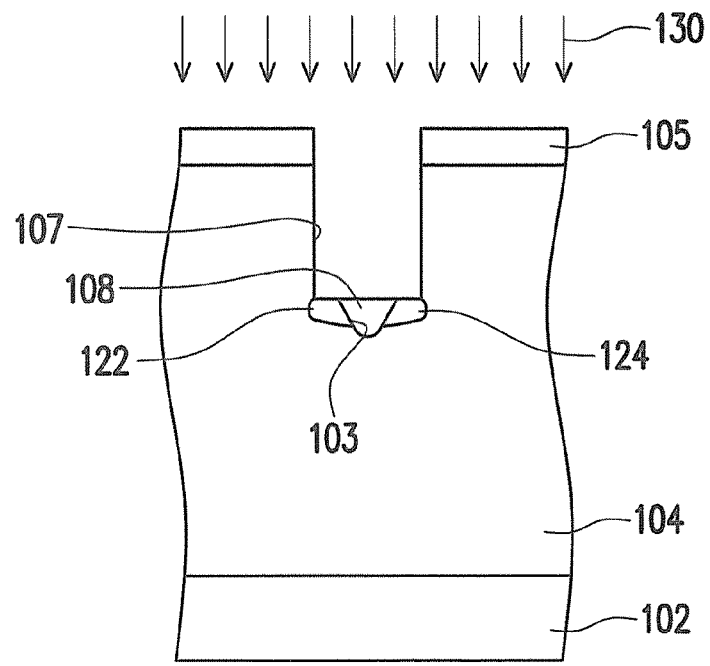

Referring to FIG. 2C, an etching back process is performed to remove the spacer 111 and a portion of the insulating material layer 132, so as to form an insulating layer 108. The insulating layer 108 at least fills up the trench 103. Thereafter, an ion implantation process is performed to implant ions 130 to the epitaxial layer 104 below the trench 107, so as to form heavily doped regions 122 and 124 in the epitaxial layer 104 below the trench 107 and beside the trench 103. It is noted that since the insulating layer 108 has filled up the trench 103, the ions 130 would not be implanted to the bottom of the trench 103.

Figure 2D:
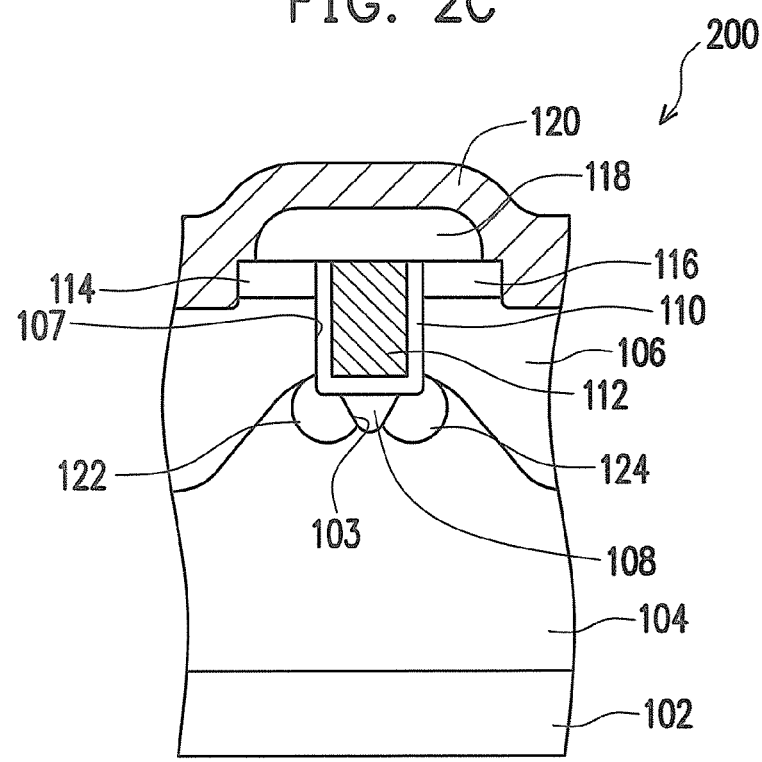

Referring to FIG. 2D, an insulating layer 110 is formed on the sidewall and bottom of the trench 107. The insulating layer 110 is composed of silicon oxide, and the forming method thereof includes performing a CVD process, for example. Meanwhile, the heavily doped regions 122 and 124 diffuse to the surrounding thereof due to high temperature in the step of forming the insulating layer 110. Thereafter, the fabrication steps shown in FIG. 1D are performed to complete a power MOSFET 200 of the second embodiment.

Third Embodiment

FIGS. 3A to 3D schematically illustrate, in a cross-sectional view, a method of fabricating a power MOSFET according to a third embodiment of the present invention. The difference between the third embodiment and the first embodiment lies in the method of forming the insulating layer 108 and the insulating layer 110. The difference between them is described in the following, and the unnecessary details are not reiterated.

First, a structure as show in FIG. 1A is provided. Thereafter, referring to FIG. 3A, a spacer material layer (not shown) is conformally formed on the substrate 102. Afterwards, an anisotropic etching process is performed to remove a portion of the spacer material layer, so as to form a spacer 111 on the sidewall of the trench 107. The spacer material layer is composed of silicon oxide, and the aiming method thereof includes performing a CVD process, for example. Further, a portion of the epitaxial layer 104 is removed using the spacer 111 as a mask, so as to form a trench 103 below the trench 107. The step of forming the trench 103 is a self-aligned process and the trench 103 divides the heavily doped region 123 into two heavily doped regions 122 and 124.

Figure 3A:
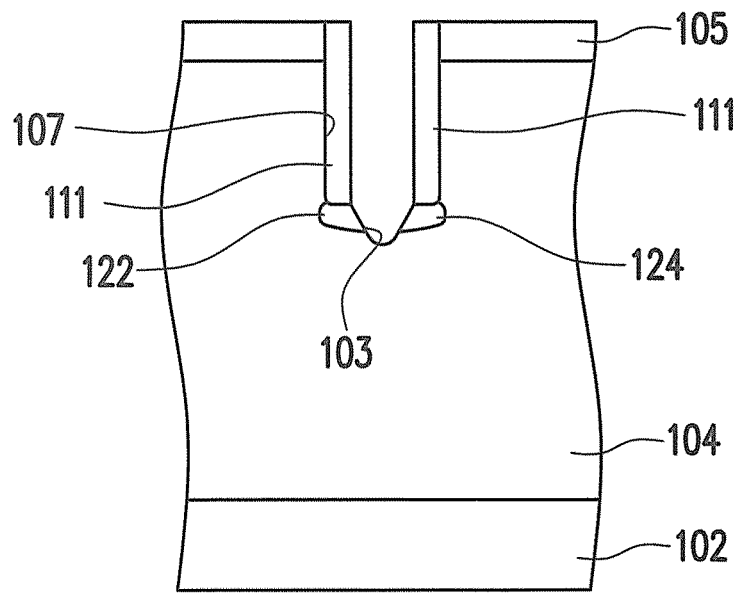
FIGS. 3A to 3C schematically illustrate, in a cross-sectional view, a method of fabricating a power MOSFET according to a third embodiment of the present invention.
Figure 3B:
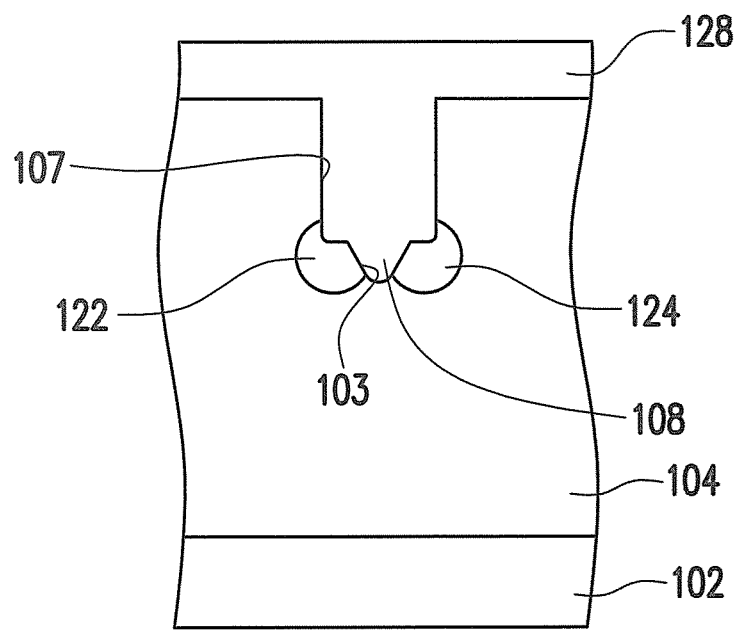

Referring to FIG. 3B, the patterned mask layer 105 and the spacer 111 are removed. Thereafter, an insulating material layer 128 is formed on the substrate 102 to fill up the trench 103 and the trench 107. The insulating material layer 128 is formed by using a material selected from silicon oxide, silicon nitride and a high-k material with a dielectric constant more than 4, for example. The method of forming the insulating material layer 128 includes performing a CVD process or a spin-coating process, for example.

Figure 3C:
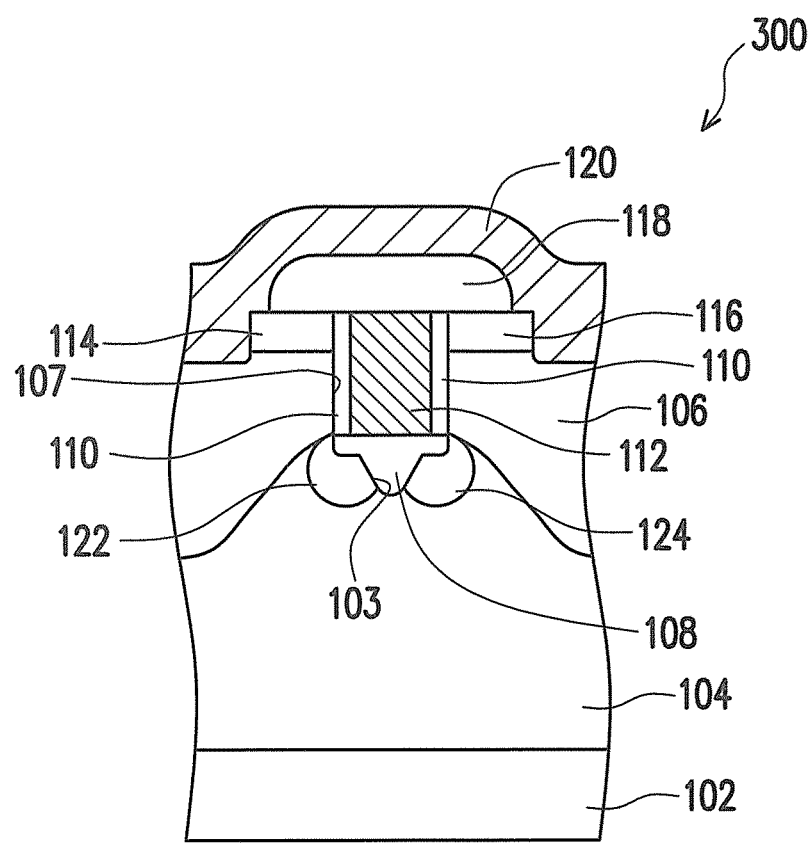

Referring to FIG. 3C, an etching back process is performed to remove a portion of the insulating material layer 128, so as to form an insulating layer 108. The insulating layer 108 at least fills up the trench 103. In this embodiment, the insulating layer 108 fills up the trench 103 and covers the bottom of the trench 107. Thereafter, an insulating layer 110 is formed on the sidewall of the trench 107. The insulating layer 110 is composed of silicon oxide, and the forming method thereof includes performing a thermal oxidation process. Meanwhile, the heavily doped regions 122 and 124 diffuse to the surrounding thereof due to high temperature in the step of forming the insulating layer 110. Afterwards, the fabrication steps shown in FIG. 1D are performed to complete a power MOSFET 300 of the third embodiment.

Fourth Embodiment

Figure 4A:
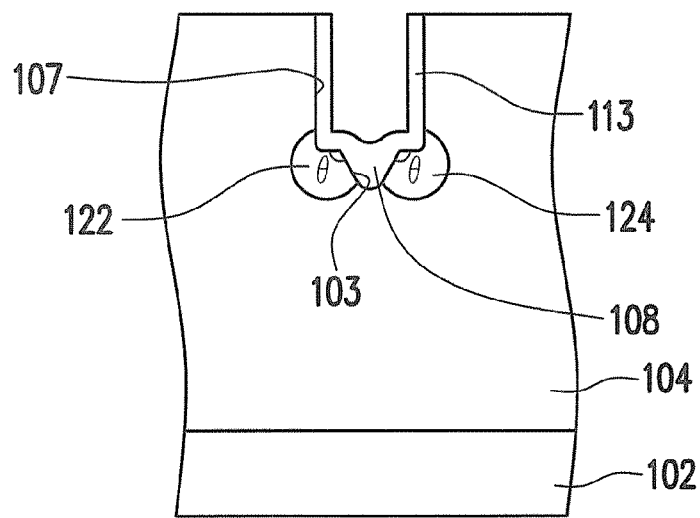
FIGS. 4A to 4B schematically illustrate, in a cross-sectional view, a method of fabricating a power MOSFET according to a fourth embodiment of the present invention.
Figure 4B:
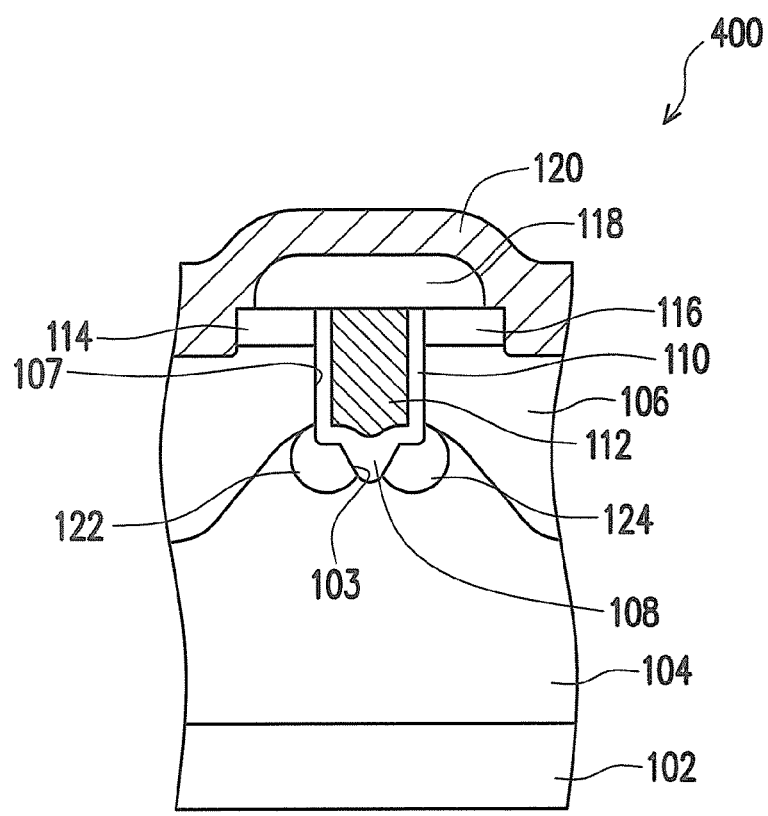

FIGS. 4A to 4B schematically illustrate, in a cross-sectional view, a method of fabricating a power MOSFET according to a fourth embodiment of the present invention. The difference between the fourth embodiment and the third embodiment lies in the method of forming the insulating layer 108 and the insulating layer 110. The difference between them is described in the following, and the unnecessary details are not reiterated.

First, a structure as shown in FIG. 3A is provided. Thereafter, referring to FIG. 4A, the patterned mask layer 105 and the spacer 111 are removed. Afterwards, a thermal oxidation process is performed to form an insulating layer 113 to fill up the trench 103 and line the sidewall and bottom of the trench 107. In other words, the insulating layer 113 in the fourth embodiment replace the insulating layers 108 and 110 described in the first, second and third embodiments. Accordingly, the two steps for forming the insulating layers 108 and 110 respectively are not required in the present embodiment. The same purpose can be achieved by performing a single step of thermal oxidation process, so as to simplify the fabrication process and to achieve competitive advantage. Moreover, in this step, since growth rate of the insulating layer 113 on the heavily doped region is faster than that on the lightly doped region, the insulating layer 113 grows faster on the sidewall of the trench 103 (due to the heavily doped regions 122 and 124 beside the trench 103) than on the sidewall of the trench 107. Meanwhile, the width and shape of the trench 103 is appropriately controlled to make sure that the insulating layer 113 fills up the trench 103 completely. For example, the parameters of the etching process can be appropriately controlled to have the included angle between the sidewall of the trench 103 and the bottom of the trench 107 greater than 90 degree, so as to prevent a void from generating during the growth of the insulating layer 113. In addition, the heavily doped regions 122 and 124 expand to the surrounding thereof due to high temperature in the step of forming the insulating layer 113.

Referring to FIG. 4B, the fabrication steps shown in FIG. 3C are performed to complete a power MOSFET 400 of the fourth embodiment.

The above-mentioned embodiments in which the first conductivity type is N-type and the second conductivity type is P-type are provided for illustration purposes, and are not construed as limiting the present invention. It is appreciated by persons skilled in the art that the first conductivity type can be P-type and the second conductivity type can be N-type.

In view of the foregoing, in the power MOSFET of the present invention, the formation of the trench 103 below the trench 170 increases the thickness of insulating layer below the conductive layer 122, but have the insulating layer on the sidewall of the trench 107 remain the same. Accordingly, with respect to the traditional power MOSFET without the formation of trench 103, the thickness of the insulating layer between the conductive layer 112 in the trench 107 and the epitaxial layer 104 is increased. Thus, the gate-to-drain capacitance $C_{gd}$ is effectively decreased to reduce switching loss. In addition, the N+ doped regions 122 and 124 beside the trench 103 can avoid a failure of the power MOSFET due to the expansion of the P-type body layer 106 to cover the bottom of the trench 107 and is helpful for preventing the avalanche current from concentrating to the bottom of the trench 107 to further promote the avalanche energy. Moreover, the fabrication method of the power MOSFET of the present invention is quite simple. With the help of self-aligned process to fabricate the trench 103 and the N+ doped regions 122 and 124, no addition mask is needed. Therefore, the fabrication cost is greatly saved and the competitive advantage is achieved.

Fifth Embodiment

FIGS. 5A to 5K schematically illustrate, in a cross-sectional view, a method of fabricating a power MOSFET according to a fifth embodiment of the present invention.

Figure 5A:
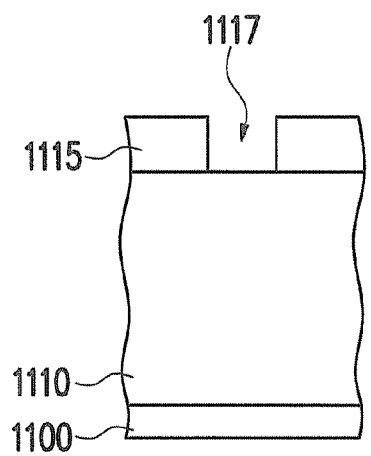
FIGS. 5A to 5K schematically illustrate, in a cross-sectional view, a method of fabricating a power MOSFET according to a fifth embodiment of the present invention.

As shown in FIG. 5A, a pattern layer 1115 is formed on a substrate. The substrate can be a silicon substrate, or a silicon substrate 1100 covered with an epitaxial layer 1110. The silicon substrate 1100 covered with the epitaxial layer 1110 is taken as an example in the figure. The silicon substrate 1100 has a high concentration of a dopant of the first conductivity type. The epitaxial layer 1110 has the same conductivity type as the silicon substrate 1100 but a lower dopant concentration. The pattern layer 115 covers the epitaxial layer 1110 and has a first opening 1117 to define a gate trench in the epitaxial layer 1110.

Figure 5B:
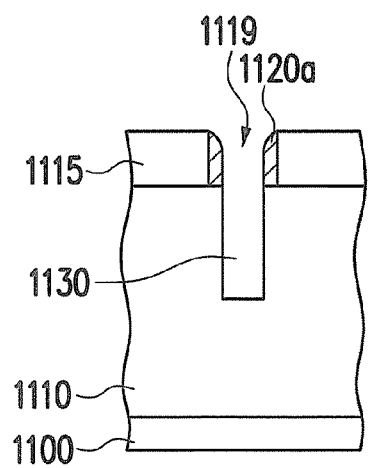

As shown in FIG. 5B, a first spacer structure 1120a is optionally formed in the first opening 1117 of the pattern layer 1115, so as to define a third opening 1119 with a narrower width in the first opening 1117. The first spacer structure 1120a can be formed by a process of fabricating a normal spacer structure. For example, a spacer material layer is conformally formed on the pattern layer 1115. Thereafter, an anisotropic etching process is performed to remove a portion of the spacer material layer on the top surface of the pattern layer 1115 and another portion of the same covering the bottom of the first opening 1117, and to remain the first spacer structure 1120a on the sidewall of the first opening 1117. Accordingly, the materials chosen for the spacer material layer and the pattern layer 1115 are different, so as to achieve the purpose of etching selectivity. For example, in this embodiment, a silicon oxide material is chosen to form the pattern layer 1115, and the silicon nitride material is chosen to form the first spacer structure 1120a. Afterwards, the pattern layer 1115 and the first spacer structure 1120a are used as an etching mask to etch the epitaxial layer 1110, so as to form a gate trench 1130 in the epitaxial layer 1110. The opening width of the gate trench 1130 substantially corresponds to the width of the third opening 1119 and is less than the width of the first opening 1117. The difference between the first opening 1117 and the third opening 1119 is decided by the thickness of the spacer material layer.

Figure 5C:
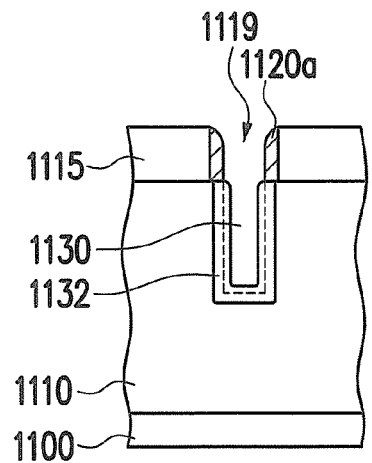

As shown in FIG. 5C, a first oxide layer 1132 is formed on the exposed surface of the epitaxial layer 1110 by an oxidation process. As the top surface of the epitaxial layer 1110 is still covered with the pattern layer 1115, the first oxide layer 1132 is formed in the gate trench 1130 and covers the sidewall and bottom of the gate trench 1130. It is noted that a portion of the epitaxial material is consumed simultaneously during the step of forming the first oxide layer 1132, so that the sidewall and the bottom of the gate trench 1130 is shifted outwardly (from the dotted line to a solid line). Thereafter, the first oxide layer 1132 is removed to expand the width of the gate trench 1130, so that the bottom width of the expanded gate trench 1130 is greater than the width of the third opening 1119. In an preferred embodiment, the above-mentioned first oxide layer 1132 can be a sacrificial oxide layer. In another embodiment, when the first spacer structure 1120a is not formed and the pattern layer 1115 is used as a mask, the bottom width of the expanded gate trench 1130 is greater than the width of the first opening 1117.

Figure 5D:
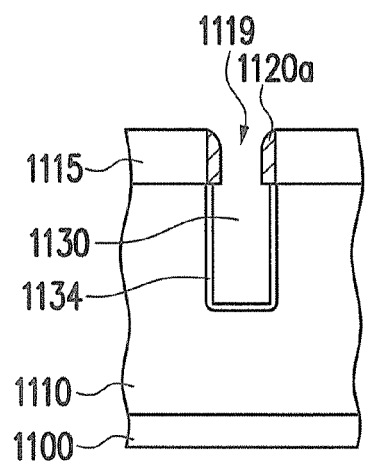
Figure 5E:
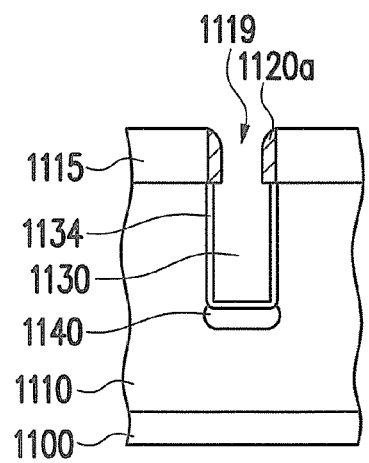

As shown in FIG. 5D, a gate oxide layer 1134 is formed on the inner surface of the gate trench 1130. Thereafter, as shown in FIG. 5E, a heavily doped region 1140 is formed in the epitaxial layer 1110 below the gate trench 1130 by an ion implantation process. It is noted that although the width of the third opening 1119 is smaller than the bottom width of the expanded gate trench 1130, the heavily doped region 1140 is laterally diffused to cover the entire bottom of the gate trench 1130 due to the characteristic of the ion implantation step. Further, in this embodiment, a tilt ion implantation step is chosen or a thermal diffusion step after the ion implantation step is performed, so as to ensure that the bottom of the gate trench 1130 is completely covered by the heavily doped region 1140.

Figure 5F:
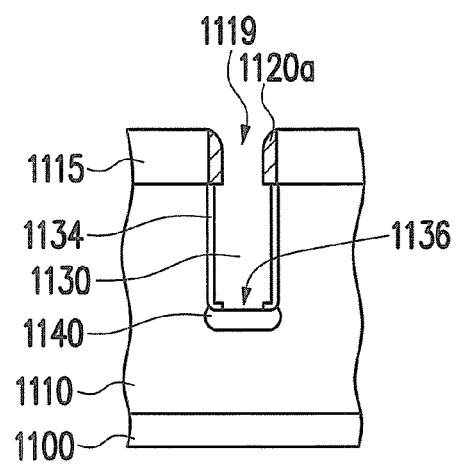

As shown in FIG. 5F, an anisotropic etching technique is performed, through the third opening 1119 defined by the pattern layer 1115 and the first spacer structure 1120a, to etch the gate oxide layer 1134 on the bottom of the gate trench 1130, so as to form a second opening 1136 exposing the heavily doped region 1140. The bottom width of the expanded gate trench 1130 is greater than the width of the second opening 1136. The second opening 1136 is substantially aligned with the third opening 1119. Besides, the gate trench 1130 prior to the expanding step, the second opening 1136 and the third opening 1119 have substantially the same width, for example. In another embodiment, when the first spacer structure 1120a is not formed and the pattern layer 1115 is used as a mask, the gate trench 1130 prior to the expanding step, the first opening 1117 and the second opening 1136 have substantially the same width.

Figure 5G:
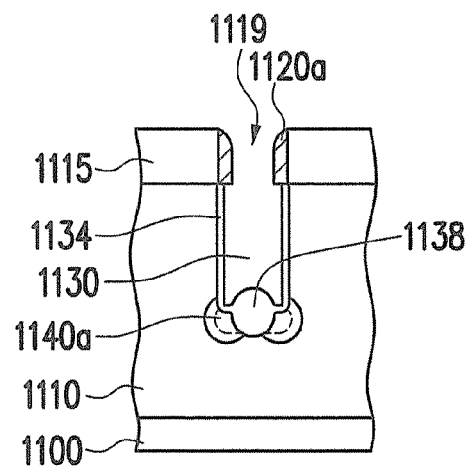

As shown in FIG. 5G, a thick oxide layer 1138 is directly formed in the second opening 1136 by an oxidation process. The thick oxide layer 1136 penetrates the heavily doped region 1140, so as to form two first heavily doped regions 1140a at two sides of the thick oxide layer 1138. In a preferred embodiment, to ensure the thick oxide layer 1138 thick enough to extend below the heavily doped region 1140, a wet oxidation process is chosen to enhance the grow rate of the oxide layer. After the step of dividing the heavily doped region 1140 into the two first heavily doped regions 1140a by the thick oxide layer 1138, a thermal diffusion step can be additionally performed, so as to adjust the profile of each first heavily doped region 1140a. As shown in the figure, the profile of each first heavily doped regions 1140a is expanded from the dotted line area to a solid line area. Further, no heavily doped region is formed below the bottom of the thick oxide layer 1138.

Figure 5H:
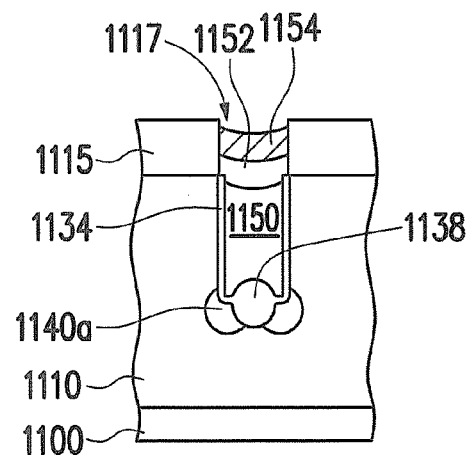

Thereafter, the first spacer structure 1120a is removed to expose the entire opening of the gate trench 1130. Afterwards, as shown in FIG. 5H, a gate polysilicon structure 1150, a first dielectric structure 1152 and a second dielectric structure 1154 are sequentially formed in the gate trench 1130 and in the first opening 1117 of the pattern layer 1115. The gate polysilicon structure 1150 is disposed in the gate trench 1130. The first dielectric structure 1152 and the second dielectric structure 1154 cover the gate polysilicon structure 1150 and are substantially disposed in the first opening 1117 of the pattern layer 1115. In this step, the materials chosen for the second dielectric structure 1154 and the pattern layer 1115 are different, so as to achieve the purpose of etching selectivity. The material of the first dielectric structure 1152 does not have such limitation.

Figure 5I:
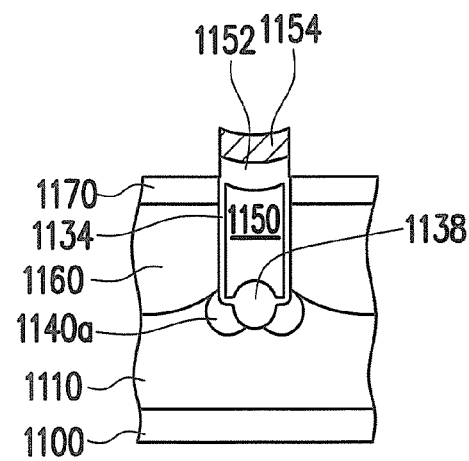

As shown in FIG. 5I, a selectively etching process is performed, so as to remove the pattern layer 1115 and retain the first dielectric structure 1152 and the second dielectric structure 1154 covering the gate polysilicon structure 1150. Thereafter, an ion implantation process is performed, so as to form a body layer 1160 to surround the gate trench 1130. The body layer 1160 is not formed at the bottom of the gate trench 1130, for example. The conductivity type of the body layer 1160 is different from that of the first heavily doped regions 1140a, so that the first heavily doped regions 1140a below the gate trench 1130 can prevent the body layer 1160 from diffusing to cover the bottom of the gate trench 1130 and causing the failure of the transistor device. In addition, the present of the first heavily doped regions 1140a is beneficial to change the profile of the lower surface of the body layer 1160, and thus, the avalanche voltage of the transistor device is increased. Besides, the depth of the body layer 1160 is increased in a direction away from the gate trench 1130, and the first heavily doped regions 1140a can adjust the depth profile of the body layer 1160. Afterwards, another ion implantation step is performed, so as to form doped regions 1170 in the surface layer of the body layer 1160.

Figure 5J:
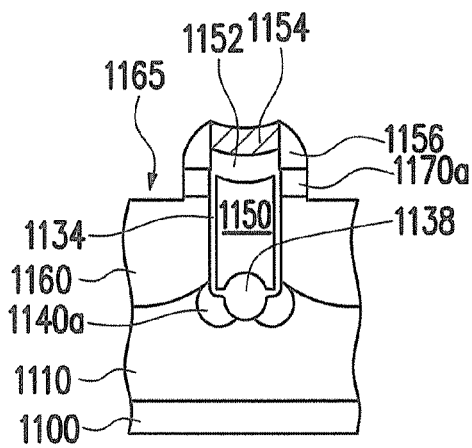

As shown in FIG. 5J, a second spacer structure 1156 is formed at two sides of the first dielectric structure 1152 and the second dielectric structure 1154, so as to define the areas for source doped regions 1170a and source contacts 1165. Thereafter, the epitaxial layer 1110 is etched by using the second spacer structure 1156 as a mask, so as to form the source contacts 1165 to penetrate the doped regions 1170, and simultaneously form the source doped regions 1170a beside the source contacts 1165.

Figure 5K:
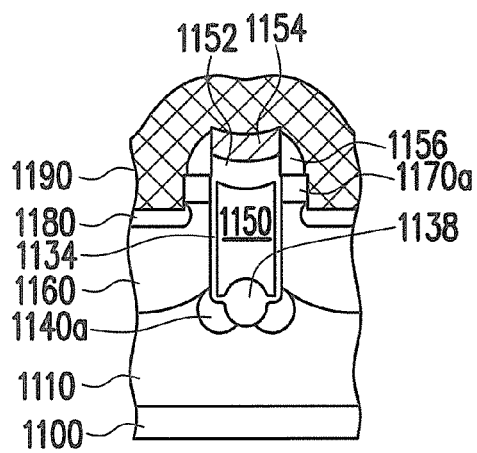

As shown in FIG. 5K, heavily doped regions 1180 are formed at the bottom of the source contacts 1165 by an ion implantation process, so as to reduce the contact resistance between the metal layer and the body layer 1160. Thereafter, a source metal layer 1190 is deposited on the epitaxial layer 1110 to electronically connect the source doped regions 1170a and the heavily doped regions 1180.

Sixth Embodiment

FIGS. 6A to 6F schematically illustrate, in a cross-sectional view, a method of fabricating a power MOSFET according to a sixth embodiment of the present invention.

Figure 6A:
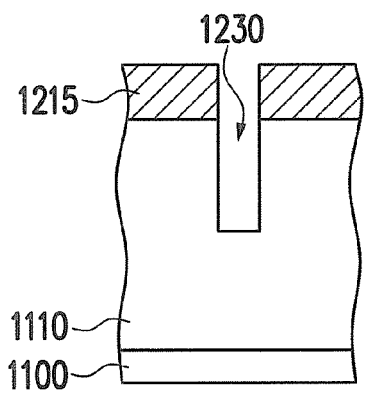
FIGS. 6A to 6F schematically illustrate, in a cross-sectional view, a method of fabricating a power MOSFET according to a sixth embodiment of the present invention.
Figure 6B:
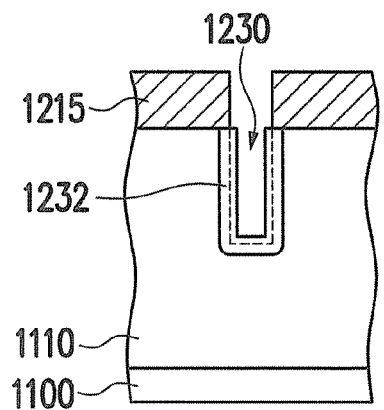
Figure 6C:
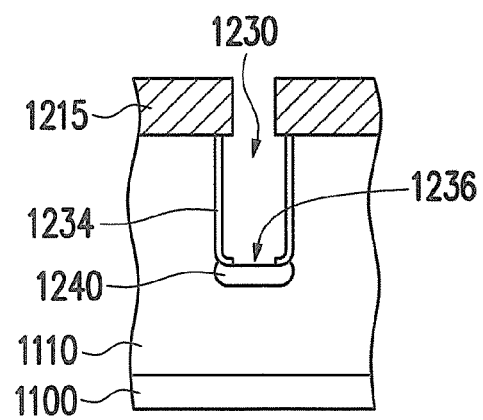
Figure 6D:
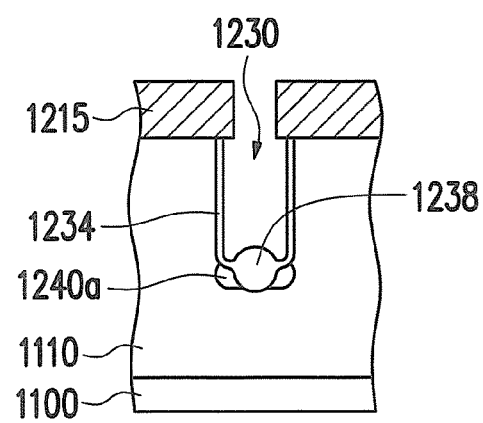
Figure 6E:
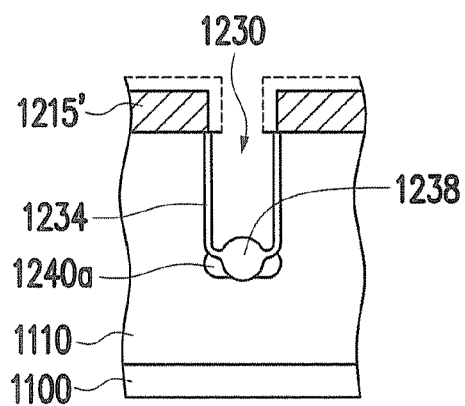

The difference between the fifth and sixth embodiments lies in that in the fifth embodiment, the first spacer structure 1120a is formed in the first opening 1117 of the pattern layer 1115 to define the opening width of the gate trench 1130, but in this embodiment, the opening of the pattern layer 1215 is directly used to define the opening width of the gate trench 1230, and the step of forming the first spacer structure 1120a is omitted, as shown in FIG. 6A. In this embodiment, as shown in FIGS. 6B to 6D, the steps of forming the first oxide layer 1232, the gate oxide layer 1234, the heavily doped region 1240, the second opening 1236, the thick oxide layer 1238 and the first heavily doped regions 1240a are substantially the same as those in the fifth embodiment, and the details are not iterated herein.

Figure 6F:
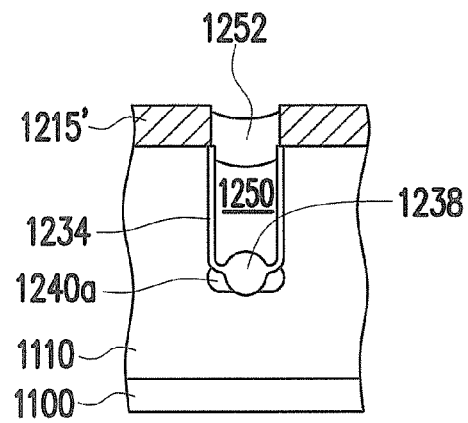

However, in this embodiment, since the step of forming the first spacer structure 1120a is not performed, the opening width of the pattern layer 1215 is smaller than that of the expanded gate trench 1230. To ensure the entire opening of the gate trench 1230 is exposed to benefit the following step of forming the polysilicon structure 1250, as shown in FIG. 6F, an etching step is performed to the pattern layer 1215 to expand the opening width of the pattern layer 1215 after the step of forming the second opening 1236. The solid line area shows the etched pattern layer 1215' in FIG. 6E. It is noted that the forming material of the pattern layer 1215 is required to be different from that of the gate oxide 1234, so that this etching step would not simultaneously remove the gate oxide layer 1234 in the gate trench 1230. For example, in this embodiment, silicon nitride is chosen to form the pattern layer 1215.

As shown in FIG. 6F, a gate polysilicon structure 1250 and a dielectric structure 1252 are sequentially formed in the gate trench 1230 and in the opening of the pattern layer 1215'. The gate polysilicon structure 1250 is completely disposed in the gate trench 1230, and the dielectric structure 1252 covers the gate polysilicon structure 1250 and extends upwardly to the opening of the pattern layer 1215'. Upon comparison between the fifth and sixth embodiments, the dielectric structure 1252 of this embodiment replaces the first dielectric structure 1152 and the second dielectric structure 1154 of FIG. 5H. However, the materials chosen for the dielectric structure 1252 and the pattern layer 1215 are required to be different, so as to achieve the purpose of etching selectivity. For example, in this embodiment, silicon nitride is chosen to form the pattern layer 1215, and silicon oxide is chosen to foam the dielectric structure 1252, so as to achieve the purpose of etching selectivity.

Seventh Embodiment

Figure 7A:
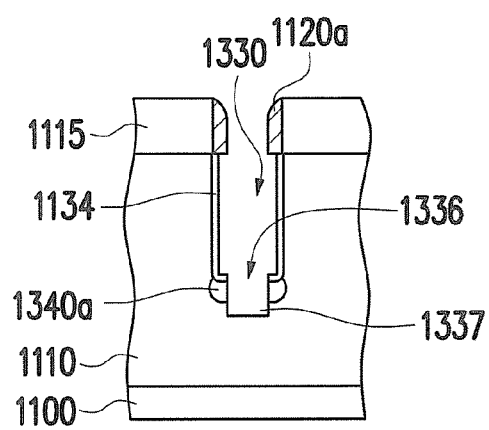
FIGS. 7A to 7C schematically illustrate, in a cross-sectional view, a method of fabricating a power MOSFET according to a seventh embodiment of the present invention.
Figure 7B:
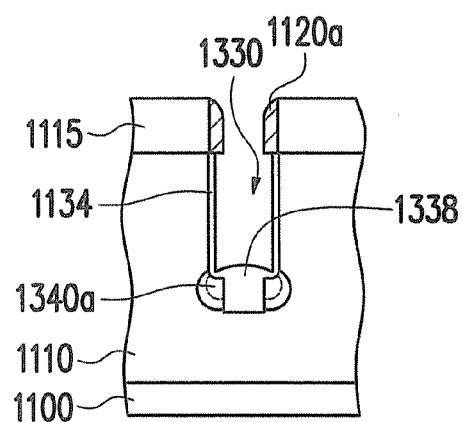
Figure 7C:
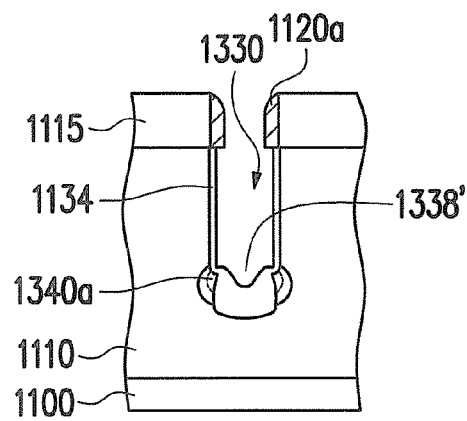

FIGS. 7A to 7C schematically illustrate, in a cross-sectional view, a method of fabricating a power MOSFET according to a seventh embodiment of the present invention.

The process step of FIG. 7A corresponds to that of FIG. 5F. As shown in the figure, in this embodiment, during the step of etching the gate oxide layer 1134 on the bottom of the gate trench 1330 through the pattern layer 1115 and the first spacer structure 1120a, in addition to the second opening 1336, a narrow trench 1337 is further formed below the second opening 1336 to penetrate the heavily doped region, and thus, two first heavily doped regions 1340a are formed at two sides of the narrow trench 1337. The opening width of the narrow trench 1337 corresponds to the width of the second opening 1336. Thereafter, as shown in FIG. 7B, a deposition process and an etching back process are sequentially performed, so as to form a thick oxide layer 1338 to at least fill up the narrow trench 1337. In FIG. 7B, the deposition process and etching back processes are used to form the thick oxide layer 1338 in the narrow trench 1337. However, the present invention is not limited thereto. As shown in FIG. 7C, in this embodiment, an oxidation process can be performed to form a thick oxide layer 1338' in the narrow trench 1337.

Eighth Embodiment

Figure 8A:
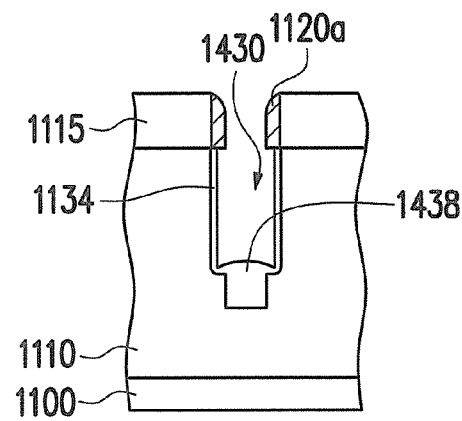
FIGS. 8A to 8C schematically illustrate, in a cross-sectional view, a method of fabricating a power MOSFET according to an eighth embodiment of the present invention.
Figure 8B:
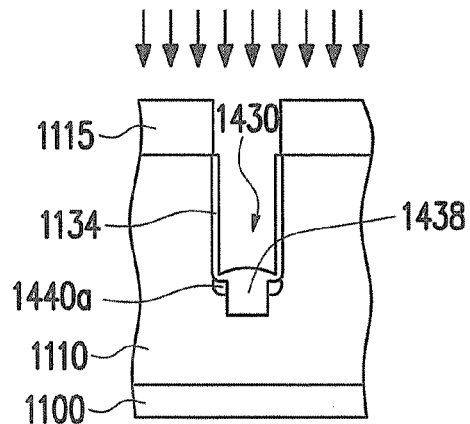
Figure 8C:
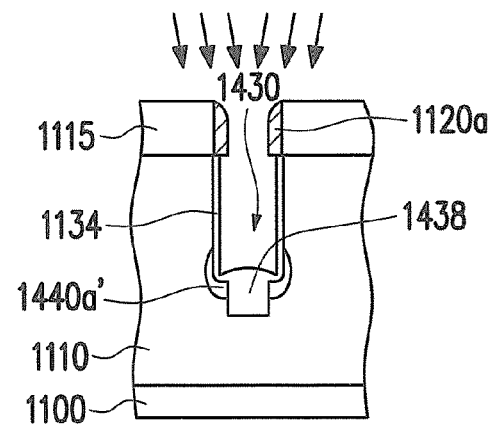

FIGS. 8A to 8C schematically illustrate, in a cross-sectional view, a method of fabricating a power MOSFET according to an eighth embodiment of the present invention.

The process step of FIG. 8A corresponds to that of FIG. 7B, but in this embodiment, as shown in FIG. 8A, no heavily doped region is disposed below the gate trench 1430 during the step of forming a thick oxide layer 1438. That is to say, in this embodiment, first heavily doped regions are formed below the gate trench 1430 after the step of forming the thick oxide layer 1438.

As shown in FIG. 8B, after the step of forming the thick oxide layer 1438, the first spacer structure 1120a is removed to expose the entire opening of the gate trench 1430. Thereafter, two first heavily doped regions 1440a are formed at two sides of the thick oxide layer 1438 by an ion implantation process. Further, no heavily doped region is disposed below the bottom of the thick oxide layer 1438.

In FIG. 8B, a vertical ion implantation process is implemented in the ion implantation step, so that the first spacer structure 1120a is required to be removed before the ion implantation step, and thus, the dopant is surely implanted in the epitaxial layer 1110 at two sides of the thick oxide layer 1438. However, the present invention is not limited thereto. As shown in FIG. 8C, in this embodiment, first heavily doped regions 1440a' can be formed by a tilt ion implantation process. Herein, the first spacer structure 1120a is not required to be removed prior to the ion implantation step, and the first spacer structure 1120a can be used as a mask to prevent the dopant from implanting to the epitaxial layer beside the gate trench 1430.

Ninth Embodiment

Figure 9:
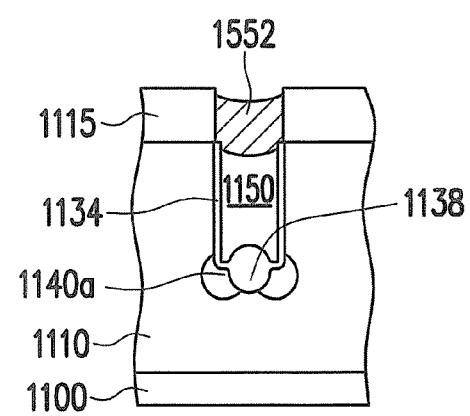
FIG. 9 schematically illustrates, in a cross-sectional view, a method of fabricating a power MOSFET according to a ninth embodiment of the present invention.

FIG. 9 schematically illustrates, in a cross-sectional view, a method of fabricating a power MOSFET according to a ninth embodiment of the present invention.

The process step of FIG. 9 corresponds to that of FIG. 5H. As shown in FIG. 9, the dielectric structure 1552 of this embodiment replaces the first dielectric structure 1152 and the second dielectric structure 1154 of FIG. 5H. However, the materials chosen for the dielectric structure 1552 and the pattern layer 1115 are different, so as to achieve the purpose of etching selectivity. The following steps of this embodiment are substantially the same as those in the fifth embodiment, and the details are not iterated herein.

Tenth Embodiment

Figure 10A:
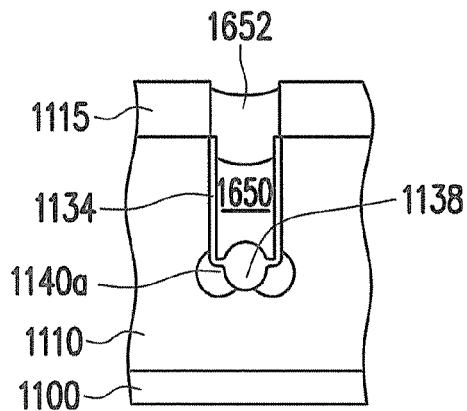
FIGS. 10A to 10C schematically illustrate, in a cross-sectional view, a method of fabricating a power MOSFET according to a tenth embodiment of the present invention.
Figure 10B:
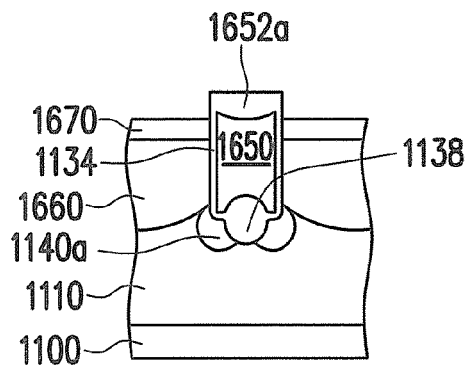
Figure 10C:
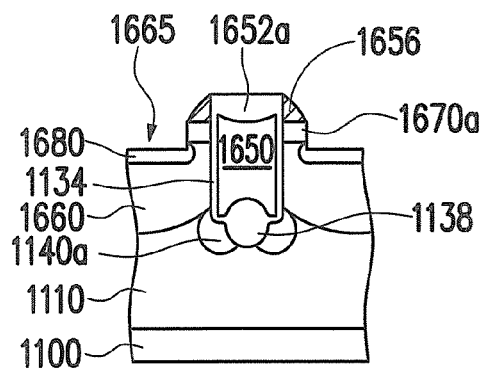

FIGS. 10A to 10C schematically illustrate, in a cross-sectional view, a method of fabricating a power MOSFET according to a tenth embodiment of the present invention.

The process step of FIG. 10A corresponds to that of FIG. 5H. As shown in FIG. 10A, in this embodiment, a gate polysilicon structure 1650 and a dielectric structure 1652 are sequentially formed in the gate trench and in the opening of the pattern layer. The upper surface of the gate polysilicon structure 1650 and the top corner of the opening of the gate trench are spaced apart by a predetermined distance, and the dielectric structure 1652 extends from the gate trench upwardly to the opening of the pattern layer 1115.

As shown in FIG. 10B, a planar process is performed to remove the pattern layer 1115 on the epitaxial layer 1110 and a portion of the dielectric structure 1652a protruding from the gate trench, and thus, a dielectric structure 1652a covering the gate polysilicon structure 1650 remains. For example, this step can be implemented with a typical chemical mechanical polishing process. Afterwards, the remaining dielectric structure 1652a can be directly used as a mask to selectively etch the epitaxial layer 1110, so that the dielectric structure 1652a protrudes from the epitaxial layer 1110. Then, a body layer 1660 and doped regions 1670 are sequentially formed in the epitaxial layer 1110 by ion implantation processes.

As shown in FIG. 10C, a second spacer structure 1656 is formed at two sides of the dielectric structure 1652a, so as to define the areas for source doped regions 1670a and source contacts 1665. Thereafter, the doped regions 1670 are etched by using the second spacer structure 1656 as a mask, so as to form the source contacts 1665 to penetrate the doped regions 1670. Afterwards, heavily doped regions 1680 are formed at the bottom of the source contacts 1665 by an ion implantation process. The following steps of this embodiment are substantially the same as those in the fifth embodiment, and the details are not iterated herein.

As stated above, in the present invention, the width of the gate trench can be expanded by forming the first oxide layer. Further, the second opening in the gate oxide layer on the bottom of the gate trench can be formed by using the opening of the pattern layer, and the thick oxide layer can be formed at the bottom center of the gate trench. Besides, in the present invention, the dielectric structure protruding from the epitaxial layer is formed on the gate polysilicon layer by using this pattern layer, and the spacer structure is formed at two sides of the dielectric structure to define the positions for the source doped regions and the source contacts. In view of the above, the fabrication method of the present invention can define the positions for the gate trench, the thick oxide layer at the bottom center of the gate trench and the source doped regions with only one photomask. Therefore, the process cost can be saved, and alignment errors easily caused by use of multiple photomasks can be avoided at the same time.

Moreover, in the method of the present invention, the thick oxide layer is formed at the bottom center of the gate trench, so that the gate-to-drain capacitance $C_{gd}$ is decreased, and the switching loss is reduced. In addition, in the method of the present invention, the first heavily doped regions are formed at two sides of the thick oxide layer, and the conductivity type of the first heavily doped regions is different from that of the body layer. Accordingly, the formation of the first heavily doped regions is helpful to adjust the profile of the body layer so as to enhance the avalanche energy.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A fabrication method of a trenched power MOSFET, at least comprising steps of:
   forming a pattern layer having a first opening on a substrate;
   removing a portion of the substrate by using the pattern layer as a mask, so as to form a gate trench in the substrate;
   expanding a width of the gate trench;
   after the step of expanding the width of the gate trench, forming a gate oxide layer on an inner surface of the gate trench;
   after the step of forming the gate oxide layer, removing a portion of the gate oxide layer on a bottom of the gate trench by using the pattern layer as a mask, so as to form a second opening exposing the substrate and located in the gate oxide layer, wherein a width of the expanded gate trench is greater than a width of the second opening;
   forming a thick oxide layer in the second opening;
   forming two first heavily doped regions at two sides of the thick oxide layer;
   forming a gate polysilicon structure in the gate trench;
   forming a body layer to surround the gate trench; and
   forming two source doped regions at two sides of the gate trench.

2. The fabrication method of claim 1, wherein the gate trench prior to the expanding step, the first opening and the second opening have substantially the same width.

3. The fabrication method of claim 1, wherein when the pattern layer is used as a mask, the width of the expanded gate trench is greater than a width of the first opening.

4. The fabrication method of claim 1, wherein a method of expanding the width of the gate trench comprises:
   oxidizing the substrate to form a first oxide layer in the gate trench, wherein the first oxide layer at least covers a sidewall of the gate trench and consumes a portion of the substrate; and
   removing the first oxide layer.

5. The fabrication method of claim 4, wherein the step of removing the first oxide layer comprises performing an isotropic etching process.

6. The fabrication method of claim 1, wherein a depth of the body layer is increased in a direction away from the gate trench, and the first heavily doped regions adjust a depth profile of the body layer.

7. The fabrication method of claim 1, further comprising forming a dielectric structure on the gate polysilicon structure after the step of forming the first heavily doped regions.

8. The fabrication method of claim 1, further comprising forming a first spacer structure in the first opening of the pattern layer after the step of forming the pattern layer, wherein the gate trench is formed in the substrate by using the pattern layer and the first spacer structure as a mask.

9. The fabrication method of claim 8, wherein the width the second opening is equal to a width of a third opening defined to correspond to the first spacer structure in the first opening.

10. The fabrication method of claim 9, wherein the gate trench prior to the expanding step, the second opening and the third opening have substantially the same width.

11. The fabrication method of claim 9, wherein the width of the expanded gate trench is greater than the width of the third opening.

12. The fabrication method of claim 1, wherein the thick oxide layer is formed in the second opening by a wet oxidation process.

13. The fabrication method of claim 1, wherein the thick oxide layer is formed in the second opening by a deposition process.

14. The fabrication method of claim 1, wherein a narrow trench is formed below the second opening during the step of forming the second opening, and an opening width of the narrow trench corresponds to the width of the second opening.

15. The fabrication method of claim 14, wherein the step of forming the first heavily doped regions comprises:
   forming a heavily doped region in the substrate below the gate trench before the step of forming the second opening, so that the narrow trench penetrates the heavily doped region and the first heavily doped regions are formed at two sides of the narrow trench.

16. The fabrication method of claim 1, wherein the step of forming the first heavily doped regions comprises:
   forming a heavily doped region in the substrate below the gate trench before the step of forming the second opening, so that the thick oxide layer penetrates the heavily doped region and the first heavily doped regions are formed at two sides of the thick oxide layer.

17. The fabrication method of claim 4, wherein a thickness of the first oxide layer is greater than a thickness of the gate oxide layer.

18. The fabrication method of claim 1, wherein the step of forming the first heavily doped regions comprises:
   performing an ion implantation process after the step of forming the thick oxide layer, so that the first heavily doped regions are formed at two sides of the thick oxide layer.

19. The fabrication method of claim 18, wherein the ion implantation process comprises a tilt ion implantation process.

20. The fabrication method of claim 1, further comprising, after the step of forming the second opening, performing an etching process to expand the width of the first opening of the pattern layer, so as to expose an entire opening of the gate trench.

21. The fabrication method of claim 8, further comprising removing the first spacer structure to expose an entire opening of the gate trench after the step of forming the second opening.

22. The fabrication method of claim 7, wherein the dielectric structure is disposed in the first opening.

23. The fabrication method of claim 22, further comprising, after the step of forming the dielectric structure, forming a second spacer structure at two sides of the dielectric structure, so as to define the source doped regions at two sides of the gate trench.

24. The fabrication method of claim 7, wherein the dielectric structure is disposed in the gate trench.

25. The fabrication method of claim 24, further comprising, after the step of forming the dielectric structure:
- removing a portion of the substrate by using the dielectric structure as a mask, so that the dielectric structure protrudes from the substrate; and
- forming a spacer structure at two sides of the dielectric structure, so as to define the source doped regions at two sides of the gate trench.

26. The fabrication method of claim 1, further comprising removing the pattern layer after the step of forming the first heavily doped regions and before the step of forming the body layer.

* * * * *